(12) United States Patent
Awujoola et al.

(10) Patent No.: US 7,166,492 B2
(45) Date of Patent: Jan. 23, 2007

(54) INTEGRATED CIRCUIT CARRIER APPARATUS METHOD AND SYSTEM

(75) Inventors: Abiola Awujoola, Union City, CA (US); Clifford R. Fishley, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 418 days.

(21) Appl. No.: 10/713,951

(22) Filed: Nov. 14, 2003

(65) Prior Publication Data

US 2005/0104172 A1     May 19, 2005

(51) Int. Cl.
*H01L 21/00*     (2006.01)
*H01L 23/02*     (2006.01)
*G06F 17/50*     (2006.01)

(52) U.S. Cl. ............. 438/106; 257/678; 438/108; 716/12

(58) Field of Classification Search ............ 257/678, 257/659; 438/125, 129, 106, 108, 612; 716/12, 716/15, 1
See application file for complete search history.

(56) References Cited

U.S. PATENT DOCUMENTS 6,677,169 B1 *   1/2004   Li .......................... 438/15
2001/0039644 A1 *  11/2001  Le Coz ..................... 716/11
2002/0053731 A1 *  5/2002   Chao et al. ................. 257/706
2002/0145185 A1 *  10/2002  Shrauger ................... 257/678
2002/0180016 A1 *  12/2002  Shrauger ................... 257/678
2003/0020094 A1 *  1/2003   Shrauger ................... 257/200
2004/0014401 A1 *  1/2004   Tsao et al. ................ 451/57
2005/0104187 A1 *  5/2005   Polsky et al. .............. 257/690

* cited by examiner

*Primary Examiner*—Stacy A Whitmore
(74) *Attorney, Agent, or Firm*—Luedeka, Neely & Graham, P.C.

(57) ABSTRACT

A carrier substrate includes an access region placed within the interior of the substrate that facilitates backside access to an integrated circuit die without damaging electrical integrity of the carrier substrate, a ring of die connection pads placed around the access region, and an array of package connection pads positioned around the perimeter of the top surface of the carrier substrate. In one embodiment, the perimeter depth of the array of package connections pads is selected to correspond to the number of electrical traces routable between minimally spaced package connection pads. The basic carrier substrate design is used to create an integrated circuit carrier family with each particular circuit carrier configured to receive a range of integrated circuit sizes and I/O counts such that each circuit carrier overlaps in size range with at least one other circuit carrier.

25 Claims, 7 Drawing Sheets

INTEGRATED CIRCUIT CARRIER APPARATUS METHOD AND SYSTEM

BACKGROUND OF THE INVENTION

1. Field of the Invention

The present invention relates generally to electronic circuits and systems. Specifically, the invention relates to apparatus, methods, and systems for packaging and testing integrated circuits.

2. Description of the Related Art

Semiconductor circuit technologies have experienced a steady march of process and materials improvements since their introduction in the later half of the $20^{th}$ century. Such improvements have significantly decreased the geometry sizes of semiconductor devices while dramatically increasing the density, clock rates, and processing power attainable on a single chip. Despite the tremendous increase in device density achievable with semiconductors, integrated circuit packaging has limited the ability to achieve a corresponding increase in density on board level products.

To address the needs resulting from improvements in semiconductor technology, a number of changes in packaging technology have been undertaken to varying degrees of success. For example, pin grid arrays, flat packs, multi-chip modules, ball grid arrays, and flip chips have all experienced some degree of commercial success. However, many of these improvements in packaging technology have proven to be too expensive to be useful for commodity parts and circuits. One notable exception is ball grid array (BGA) packaging technology. While newer technologies exists, solder ball connections have proven to be cost-effective in that they may be placed in a dense two dimensional array resulting in small packages with high I/O capacity.

The requirements and improvements imposed upon test equipment have also increase dramatically with increased circuit density and speeds. The sheer number of devices and circuit paths involved with modern integrated circuits require the ability to independently test specific subsystems or components on a chip. Traditionally, testing and analysis of specific circuits within an integrated circuit has required additional circuitry and/or physical contact with the circuit via finely positioned probes. Such physical contact has become increasingly impractical and may damage the devices or signal paths under test.

In response to the demand for non-invasive techniques, laser interferometry has emerged as an important tool for testing and analyzing integrated circuits. Laser interferometry measures the effect of signal voltage on the phase information of a reflected beam to estimate the voltage of a particular point within an integrated circuit.

However, despite the tremendous advantage available with laser interfereometry, backside access to an integrated circuit die is required for use and most packaging technologies are currently not amenable to such access. For example, milling the bottom of a BGA package to access the backside of an integrated circuit die typically destroys circuit traces on the substrate thus limiting or preventing the use of test equipment designed for backside access.

Another challenge in packaging systems is the cost associated with designing a package for each unique integrated circuit. Each circuit may have a unique die size and I/O requirements. The time and expense involved with routing signals and bonding pads on a package substrate significantly increases the cost of introducing an integrated circuit. Particularly with application specific integrated circuits (ASICS), packaging standardization is needed in order to reduce the cost of producing custom chips.

What is needed is a standardized packaging solution that facilitates backside access and testing to a wider variety of custom integrated circuits. Specifically, what is needed is a packaging family of integrated circuit carriers that is capable of receiving a wide range of integrated circuit sizes and I/O counts with a small number of circuit carriers capable of supporting backside analysis and high density package connectors such as BGA connectors.

BRIEF SUMMARY OF THE INVENTION

The present invention has been developed in response to the present state of the art, and in particular, in response to the problems and needs in the art that have not yet been fully solved by currently available integrated circuit packaging means and methods. Accordingly, the present invention has been developed to provide an apparatus, method, and system for packaging integrated circuits that overcome many or all of the above-discussed shortcomings in the art.

In one aspect of the present invention, an apparatus for packaging and providing backside access to an integrated circuit includes a carrier substrate, an array of package connection pads positioned around a periphery of a top surface of the carrier substrate, a ring of die connection pads positioned within the array of package connection pads, and an access region positioned within the ring of die connection pads that facilitates backside access to the integrated circuit die without damaging electrical integrity of the carrier substrate. Backside access is facilitated by restricting circuit traces from the access region.

In certain embodiments, the array of package connection pads has a perimeter depth substantially equal to a maximum number of signal traces that are routable between minimally spaced package connection pads. Restricting the perimeter depth in this manner facilitates routing the traces on the carrier substrate with a single signal layer resulting in reduced manufacturing costs while maintaining the connection density of the packaged integrated circuit.

In certain embodiments, the ring of die connection pads comprise four quadrants of bonding fingers with each quadrant arranged in an arc-shaped pattern such that the bonding fingers within each quadrant are substantially equally distanced from an edge of the integrated circuit die. Having equally distanced bonding fingers increases the range of die sizes usable with a particular carrier substrate.

In certain embodiments, the carrier substrate is essentially a printed circuit board. Grounding and power rings may be placed inside the ring of die connection pads and surrounding the access region and substrate cavity in order to improve the power distribution and grounding capabilities of the integrated circuit package.

The carrier substrate may have a substrate cavity that receives the integrated circuit die. In one embodiment, the access region corresponds to an inner portion of the substrate cavity. A base such as a metallic plate may be bonded to the bottom surface of the carrier substrate to improve EMI shielding, heat dissipation, and package stiffness. The integrated circuit die may be positioned within the substrate cavity and attached to the bottom of the cavity or directly to the base if the substrate cavity is bottomless.

A package body may be molded over the integrated circuit die, substrate cavity, and any die connections (without covering the array of package connection pads positioned around the periphery of a top surface of the carrier substrate,) in order to physically protect the integrated circuit.

Package connectors such as an array of solder balls may be attached to the array of package connection pads in order to facilitate connectivity to other devices and integrated circuits.

In another aspect of the invention, a method for designing an integrated circuit carrier with backside access to an integrated circuit includes placing an array of package connection pads around a periphery of a top surface of a carrier substrate, placing a ring of die connection pads within the array of package connection pads, and reserving an access region for conducting backside access to the integrated circuit die. The method may also include selecting a perimeter depth for the array of package connection pads that is less than a package connection pad spacing divided by a trace pitch and selecting a quadrant shape for a quadrant of bonding fingers such that the bonding fingers are substantially equally distanced to an edge of an integrated circuit die.

Furthermore, the method for designing an integrated circuit carrier with backside access to an integrated circuit may also include routing traces between a ring of die connection pads and an array of package connection pads without penetrating the access region. The various method steps facilitate designing low-cost integrated circuit carriers and packages using readily available manufacturing and testing processes.

In another aspect of the invention, a method for packaging and providing backside access to an integrated circuit includes electrically connecting an integrated circuit die to a ring of die connection pads on a top surface of a carrier substrate, attaching a cover to a bottom surface of the carrier substrate, and removing a portion of the cover within an access region in order to access a backside of the integrated circuit without damaging electrical connectivity of the substrate. The described method facilitates analysis and testing of integrated circuits using testing equipment also used on flip-chip packages.

In another aspect of the present invention, an integrated circuit carrier family that facilitates packaging and providing backside access to a wide variety of integrated circuits includes a plurality circuit carriers that conform to the aforementioned design. Each particular circuit carrier of the carrier family is configured to receive a range of integrated circuit sizes and I/O counts, with each circuit carrier overlapping in size range with at least one other circuit carrier of the plurality of circuit carriers. In one embodiment, each circuit carrier overlaps in size range with no more than two other circuit carriers of the carrier family.

The present invention provides low-cost packaging to a wide variety of integrated circuits using a small number of carriers that are manufacturable with existing processes and test equipment. These and other features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

It will be readily understood that the components of the present invention, as generally described and illustrated in the Figures herein, may be arranged and designed in a wide variety of different configurations. Thus, the following more detailed description of the embodiments of the apparatus, method, and system of the present invention, as represented in FIGS. 1 through 11, is not intended to limit the scope of the invention, as claimed, but is merely representative of selected embodiments of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment and the described features, structures, or characteristics may be combined in any suitable manner in one or more embodiments.

Figure 1:
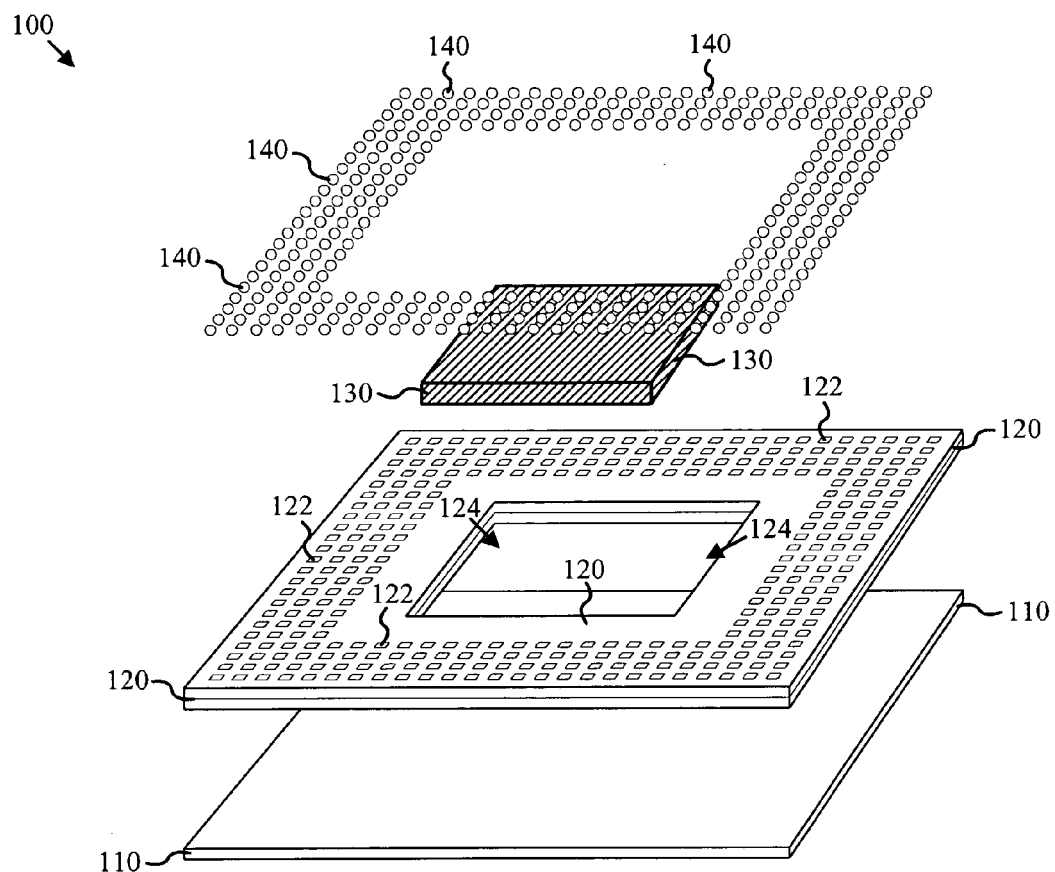
FIG. 1 is a perspective view illustration depicting various elements of one embodiment of an integrated circuit carrier of the present invention.
Figure 2:
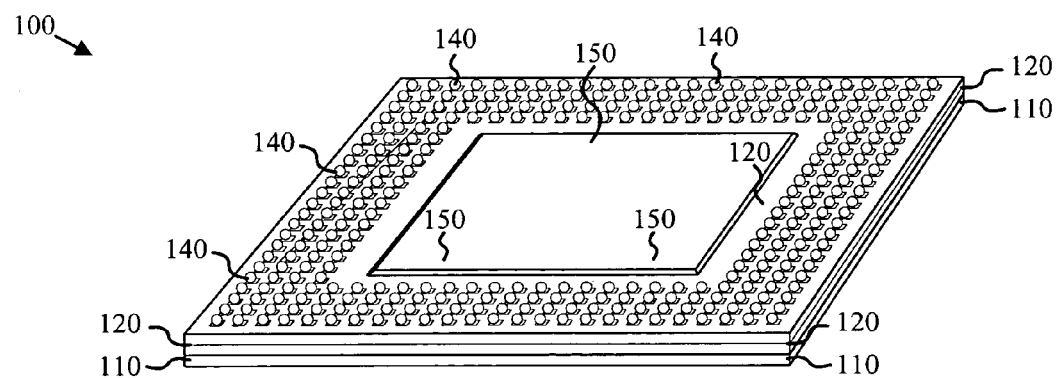
FIG. 2 is a perspective view illustration depicting one embodiment of a fully assembled integrated circuit carrier of the present invention.

FIGS. 1 and 2 are perspective view illustrations depicting one embodiment of an integrated circuit carrier 100 of the present invention. As depicted, the integrated circuit carrier 100 includes a base 110, a carrier substrate 120 with connection pads 122, an integrated circuit die 130, an array of package connectors 140, and a package body 150. Other elements that are omitted in FIGS. 1 and 2 will be shown in subsequent Figures. The integrated circuit carrier 100 facilitates packaging a wide variety of integrated circuits, such as application specific integrated circuits (ASICS), in a cost-effective manner.

The base 110 may provide a variety of functions for the integrated circuit carrier 100 such as package stiffening, electromagnetic shielding, heat dissipation, package labeling, and the like. In certain embodiments, the base 110 is constructed from a metallic material such as copper with high electric and thermal conductivity. While depicted on the bottom of the integrated circuit carrier 100 (in order to illustrate construction of the integrated circuit carrier 100,) the base 110 will typically be the top layer of the integrated circuit carrier 100 when attached to a printed circuit board or the like. The precise characteristics of the base 110 may be application specific.

The carrier substrate 120 and a set of die connections (not shown) provide electrical connectivity between the integrated circuit die 130 and the package connectors 140. In the depicted embodiment, the carrier substrate 120 includes a carrier cavity 124 designed to receive the integrated circuit die 130. The depicted carrier substrate 120 also includes an array of connection pads 122 that receive and electrically connect to the package connectors 140. In the depicted embodiment, the package connectors 140 are an array of solder balls that are attached to the connection pads 122.

The integrated circuit carrier 100 is arranged in a manner that facilitates backside access to the integrated circuit die 130. For example, in the depicted embodiment, a portion of the base 110, referred to as an access region, may be removed from a completed integrated circuit carrier 100. Once removed, analysis tools common to flip-chip packages may be used to characterize and test the integrated circuit. The ability to use a common tool set reduces the cost of manufacturing the integrated circuit carrier 100.

Figure 3:
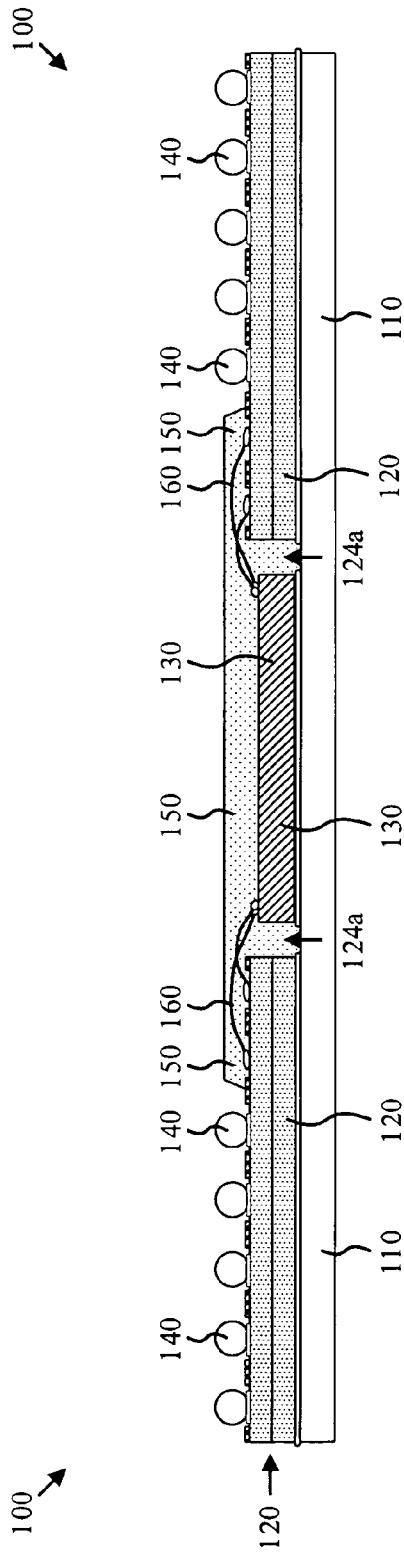
FIG. 3 is a cross-sectional illustration depicting one embodiment of an integrated circuit carrier of the present invention.
Figure 4:
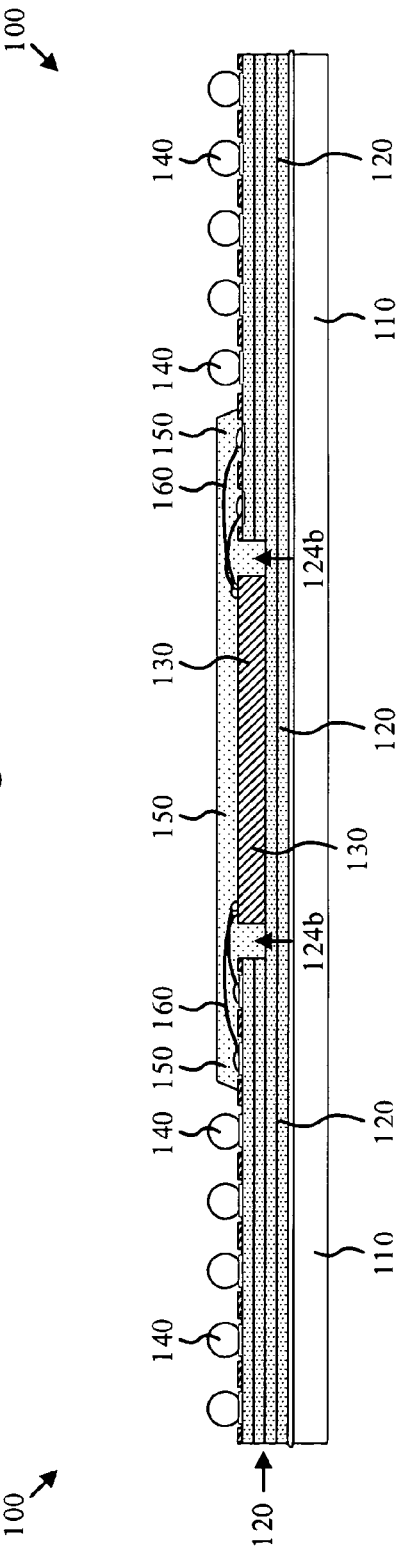
FIG. 4 is a cross-sectional illustration depicting another embodiment of an integrated circuit carrier of the present invention.

FIGS. 3 and 4 are cross-sectional illustrations depicting specific embodiments of the integrated circuit carrier 100. In addition to the elements depicted in FIGS. 1 and 2 such as the base 110, the carrier substrate 120, the integrated circuit die 130, the package connectors 140, and the package body 150, the depicted embodiments include a set of die connections 160 that electrically connect the integrated circuit die 130 with the carrier substrate 120. In the depicted embodiments, the die connections 160 are wire-bond connections.

In certain embodiments, the carrier substrate 120 is essentially a printed circuit board. In FIG. 3, the carrier substrate 120 is a two layer printed circuit board with a complete cavity 124a, while in FIG. 4 the carrier substrate 120 is a four layer printed circuit board with a partial cavity 124b. In certain embodiments, specific aspects of the layout of the carrier substrate 120 depicted in FIGS. 3–5, and 10 facilitate using very few layers of printed circuitry while maintaining high I/O density for the integrated circuit carrier 100. Some layers of the carrier substrate 120 may be signal layers while other layers may be power or ground planes.

Figure 5:
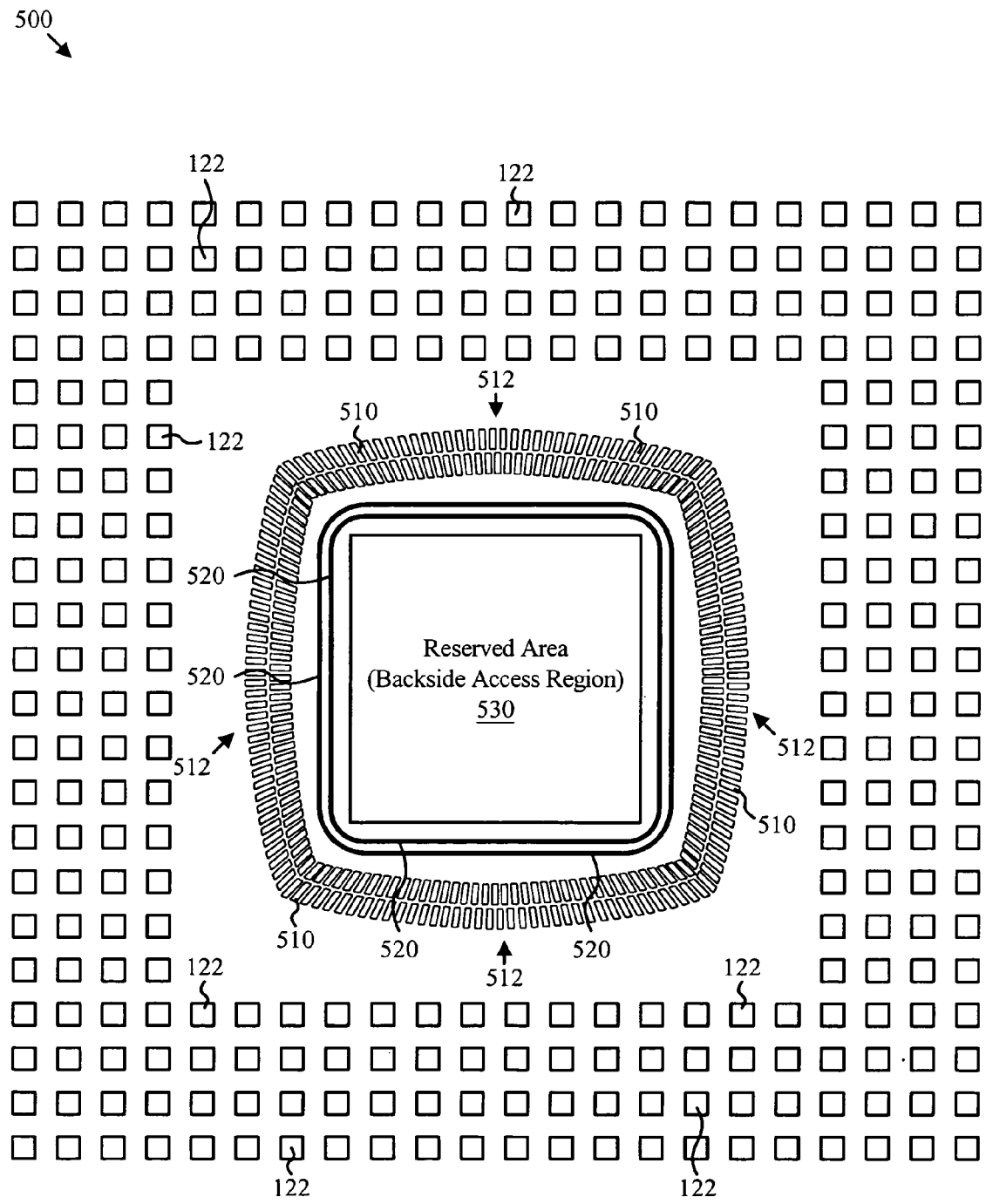
FIG. 5 is a top view illustration depicting one embodiment of a carrier substrate layout of the present invention.

FIG. 5 is a top view illustration depicting one embodiment of a carrier substrate layout 500 of the present invention. The carrier substrate layout 500 includes an array of package connection pads 122, one or more rings of die connection pads 510, one or more power or ground rings 520, and a reserved area 530. The layout of the carrier substrate layout 500 facilitates packaging a wide variety of integrated circuits using a common carrier substrate.

As noted previously, the package connection pads 122 facilitate receiving and electrically connecting to an array of package connectors such as the package connectors 140 depicted in FIGS. 1–4. Similarly, the die connection pads 510 facilitate receiving and electrically connecting to the die connections 160, or the like, which provide electrical connectivity to an integrated circuit die.

The power or ground rings 520 provide a convenient mechanism to distribute a power or ground termination to various locations on a carrier substrate. The power or ground rings 520 may also be used to improve the electromagnetic shielding of the integrated circuit carrier 100. In certain embodiments, the power or ground rings are connected to power and ground planes of the carrier substrate 120.

The reserved area 530 is void of signal traces or connections. The reserved area 530 provides an access region for conducting backside access and analysis of an integrated circuit without damaging the electrical connectivity provided by the integrated circuit carrier 100. In certain embodiments, the reserved area 530 corresponds with the carrier cavity 124.

One challenge in connecting a carrier substrate such as the carrier substrate 120 to various integrated circuit dies is that the manufacturable geometries on the carrier substrate are typically larger than the geometries on the integrated circuit die 130. As a result, the connections between the integrated circuit die 130 typically expand or fan out to mate with the connection pads 510 on the carrier substrate 120.

Figure 6:
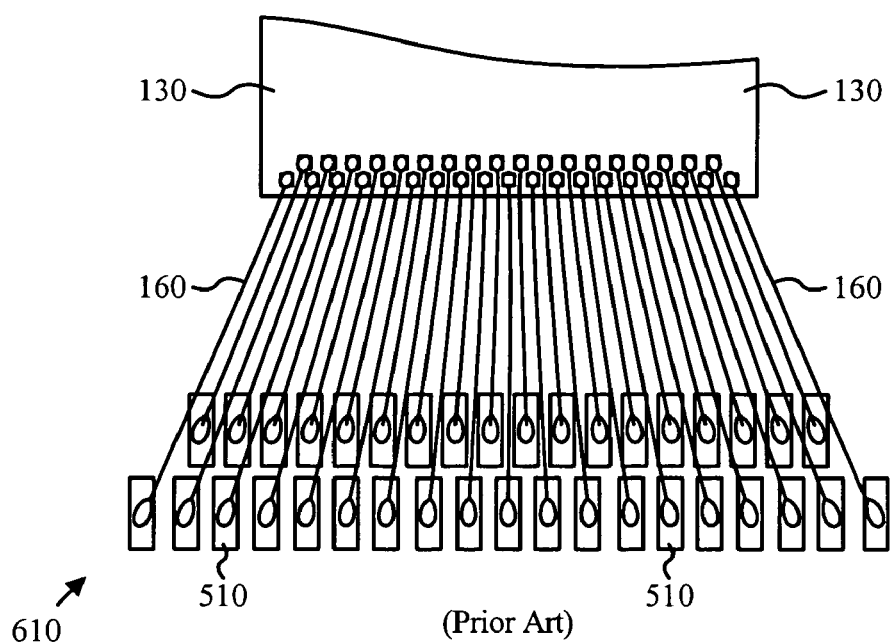
FIG. 6 is a top view illustration depicting one embodiment of a prior art die connection layout.
Figure 7:
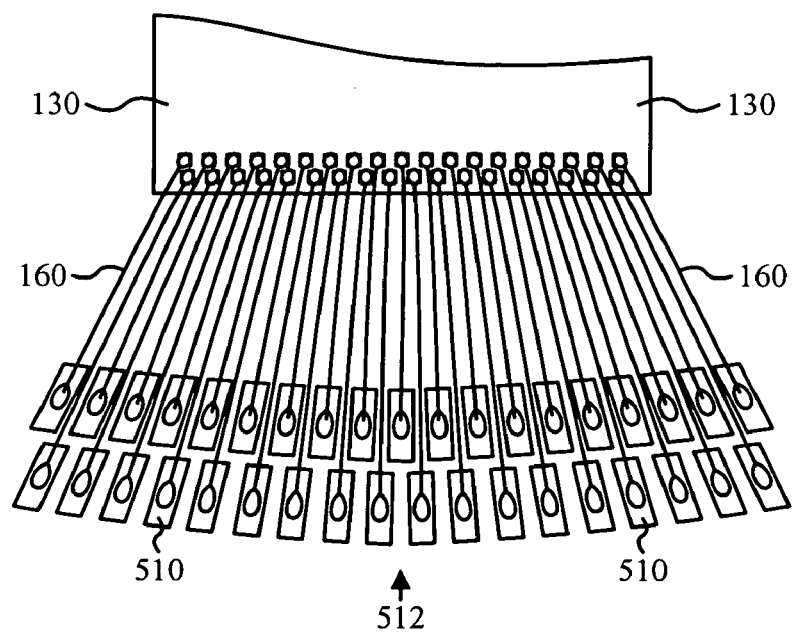
FIG. 7 is a top view illustration depicting one embodiment of a die connection layout of the present invention.

As shown in FIG. 6, a typical prior art connection pattern 610 illustrates that connection lengths and impedances typically vary according to position within the connection pattern 610 of the die connection pads 510. In contrast, the die connection pads 510 depicted in FIG. 5 are arranged in a ring comprised of four arc-shaped connection patterns 512. As detailed in FIG. 7, the arc-shaped pattern 512 facilitates creating die connections 160 to an integrated circuit die 130 that are substantially the same length and impedance regardless of position within the pattern. The ability to use die connections that are substantially the same length may increase the range of die sizes supportable with an integrated circuit carrier such as the integrated circuit carrier 100.

Figure 8:
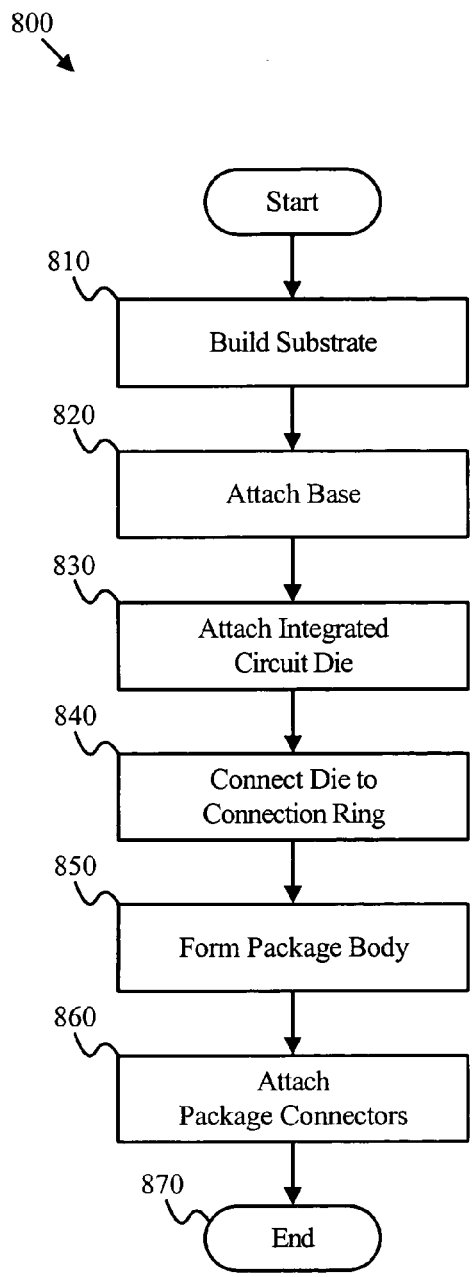
FIG. 8 is a flow chart diagram depicting one embodiment of an integrated circuit packaging method of the present invention.

FIG. 8 is a flow chart diagram depicting one embodiment of an integrated circuit packaging method 800 of the present invention. The integrated circuit packaging method 800 includes a build substrate step 810, an attach base step 820, an attach integrated circuit die step 830, a connect die step 840, a form package body step 850, and an attach package connectors step 860. The integrated circuit packaging method facilitates manufacturing an integrated circuit package such as the integrated circuit carrier 100 depicted in FIGS. 1–4. While depicted in a certain sequential order, other sequences may be deployed suitable to the particular product application and manufacturing equipment.

The build substrate step 810 builds a substrate such as the carrier substrate 120 depicted in FIGS. 1–4. In one embodiment, the substrate is build using printed circuit material and techniques. The attach base step 820 attaches a base to the substrate such as the base 110 described previously. In one embodiment, the base is attached by bonding the carrier substrate to the base.

The attach integrated circuit die step 830 attaches an integrated circuit die to the substrate or the base. In one embodiment, the integrated circuit die is postioned within a substrate cavity and bonded to the base. The connect die step 840 electrically connects the integrated circuit die to the substrate. In one embodiment, bonding pads positioned around the periphery of the integrated circuit die are wire-bonded to a ring of die connection pads on the substrate.

The form package body step 850 forms a package body such as the package body 150 that covers the integrated circuit die and associated die connections. In one embodiment, the package body is formed using an injection molding process. The attach package connectors step 860 attaches package connectors such as pins, leads, or solder balls to package connection pads on the substrate. Subsequent to completion of the attach package connectors step 860, the integrated circuit packaging method 800 ends 870.

Figure 9:
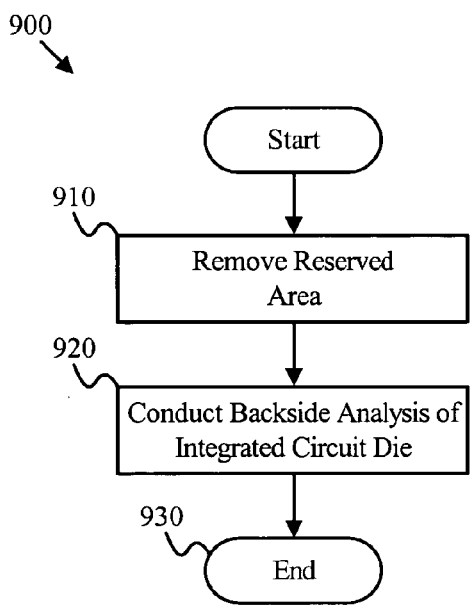
FIG. 9 is a flow chart diagram depicting one embodiment of a backside analysis method of the present invention.

FIG. 9 is a flow chart diagram depicting one embodiment of a backside analysis method 900 of the present invention. The depicted backside analysis method 900 includes a remove reserved area step 910 and a conduct backside analysis step 920. The design and construction of the integrated circuit carrier 100 facilitates conducting the backside analysis method 900.

The remove reserve area step 910 removes all or a portion of the area reserved for backside access to the integrated circuit die. In one embodiment, the area is removed by milling through the base 110 and the reserved area of the substrate 120 if needed. Although the reserved area is removed, the integrated circuit die remains functionally intact within the package. Once removed, the conduct backside analysis step 920 conducts a backside analysis of the integrated circuit using equipment designed for such analysis such as a laser interferometer.

Figure 10:
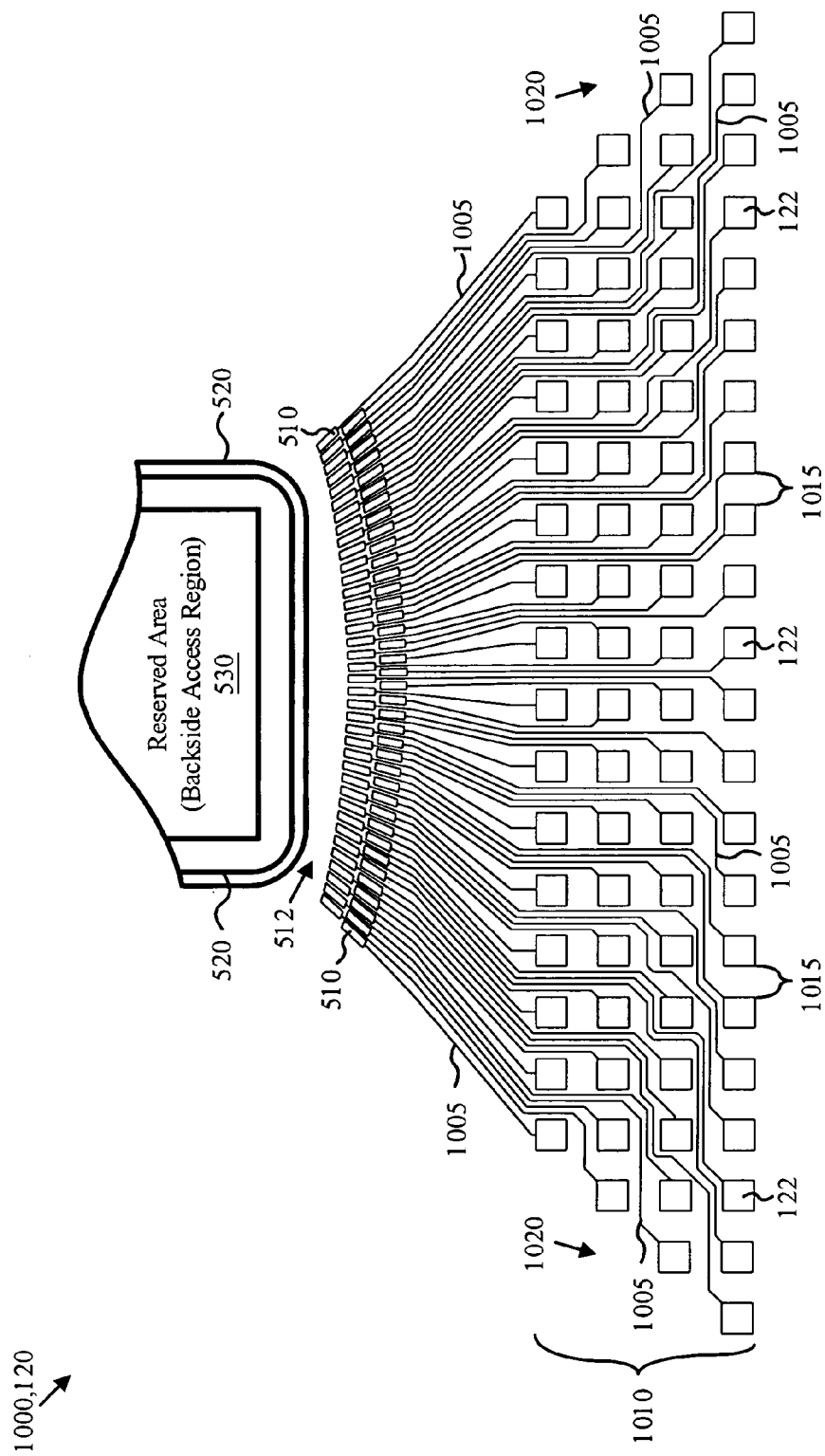
FIG. 10 is a top view illustration depicting one embodiment of a signal layer layout of the present invention.

FIG. 10 is a top view illustration depicting one embodiment of a signal layer layout 1000 of the present invention. The depicted signal layer layout 1000 includes a set of package connection pads 122 positioned around the perimeter of a carrier substrate 120, a set of die connection pads 510 arranged in a arc-shaped connection pattern 512, and a set of electrical traces 1005 that connect each die connection pad 510 to a package connection pad 122. The signal layer layout 1000 facilitates building a compact integrated circuit carrier such as the integrated circuit carrier 100. For purposes of simplicity a single quadrant of the signal layer layout 1000 is depicted in FIG. 10.

In certain embodiments, a perimeter depth 1010 corresponds to the number of signal traces that may be routed between minimally spaced connection pads 122. In such embodiments, the perimeter depth may be selected to be less than the ratio of a minimal connection pad spacing 1015 divided by a minimum electrical trace pitch (not labeled). Restricting the perimeter depth 1010 to the number of signal traces that may be routed between minimally spaced connection pads provides a layout that in most cases is routable with a single signal layer. Using a single signal layer reduces the cost of the integrated circuit carrier 100.

For example, in the arrangement depicted in FIG. 10 four electrical traces may be routed between the package connection pads 122. Consequently, the perimeter depth 1010 is also restricted to four connection pads 122 in order to route electrical traces to each connection pad 122 including the connection pads 122 within the corners 1020. As shown, traces from the die connection pads 510 are routed in clusters of four traces and directed between columns of the package connection pads 122. Under the depicted arrangement, traces may be routed to the corners 1020 of the substrate in that at least one trace between each column of package connection pads may used to route traces towards the corners 1020 which have no direct access to the die connection pads 510.

Table I shows various die size ranges and package connections counts supportable with one embodiment of a family of integrated circuit carriers of the present invention. Using a relatively few number of integrated circuit carriers 100 a wide range of integrated circuits may be packaged in a cost-effective manner. The depicted die size ranges and I/O counts are exemplary of the present invention using presently available process technologies and are subject to process improvements such as improvements in package connection spacing and electrical trace pitch.

Figure 11:
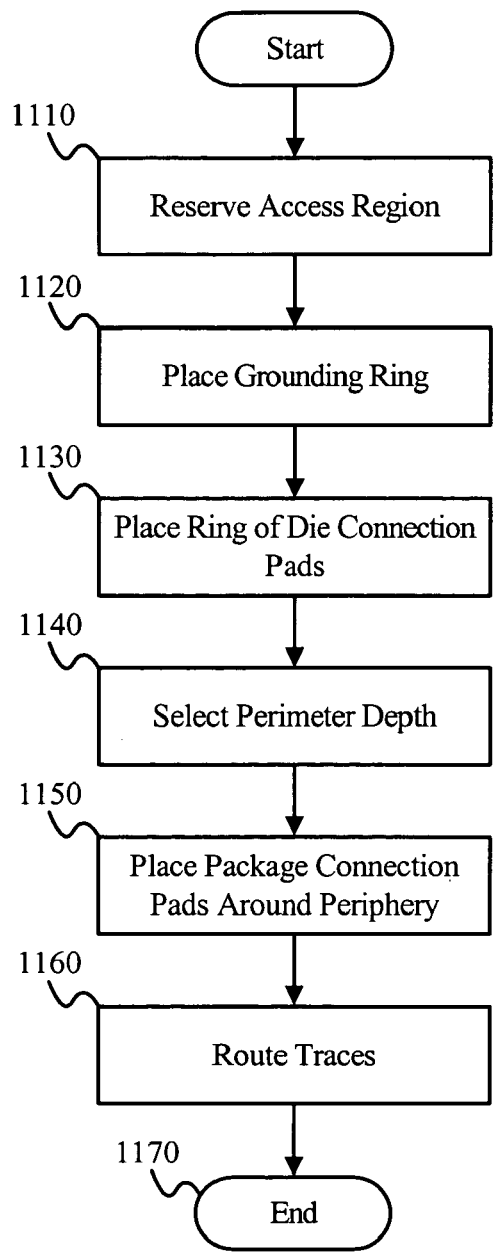
FIG. 11 is a flow chart diagram depicting one embodiment of a substrate carrier layout method of the present invention.

FIG. 11 is a flow chart diagram depicting one embodiment of a substrate carrier layout method 1100 of the present invention. The substrate carrier layout method 1100 includes a reserve access region step 1110, a place grounding ring step 1120, a place die connection ring step 1130, a select perimeter depth step 1140, a place package connection pads step 1150, and a route traces step 1160.

TABLE I

Integrated Circuit Carrier Family

| Minimum Die Length (mm) | Maximum Die Length (mm) | Package Size (mm SQ) | Connection Grid Size | Connection Perimeter Depth | Package Connections |
|---|---|---|---|---|---|
| 2.85 | 6.15 | 30 | 23 × 23 | 5 | 360 |
| 5.17 | 8.53 | 40 | 30 × 30 | 6 | 576 |
| 7.18 | 9.10 | 45 | 34 × 34 | 6 | 672 |
| 8.42 | 11.10 | 47.5 | 40 × 40 | 6 | 816 |
| 9.35 | 12.90 | 50 | 44 × 44 | 6 | 912 |
| 10.43 | 13.90 | 52.5 | 48 × 48 | 6 | 1008 |

The reserve access region step 1110 reserves a region of the layout for backside access and prohibits routing electrical traces within that region. A place grounding ring step 1120 places one or more grounding or power rings around the reserved region. A place die connection ring step 1130 places a ring of arc-shaped patterns of die connection pads around the grounding or power rings such as depicted in FIG. 5.

A select perimeter depth step 1140 selects a perimeter depth for the package connection pads, while the place package connection pads step 1150 places the package connection pads around the perimeter of the layout. In one embodiment, the perimeter depth is selected to be less than the minimum package connection pad spacing divided by the minimum electrical trace pitch. The route traces step 1160 routes electrical traces between each die connection pad and a corresponding package connection pad.

The present invention provides low-cost packaging to a wide variety of integrated circuits using a small number of carriers that are manufacturable with existing processes and test equipment. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for packaging and providing backside access to
    an integrated circuit, the apparatus comprising:
    a carrier substrate;
    an array of package connection pads positioned around a periphery of a top surface of the carrier substrate;
    a ring of die connection pads positioned within the array of package connection pads, the ring of die connection pads configured to provide electrical connectivity to an integrated circuit die; and
    an access region positioned within the ring of die connection pads, the access region configured to facilitate backside access to the integrated circuit die by removal of as much as all of the access region without damaging electrical integrity of any circuit traces of the carrier substrate.

2. An apparatus for packaging and providing backside access to an integrated circuit, the apparatus comprising:

a carrier substrate;

an array of package connection pads positioned around a periphery of a top surface of the carrier substrate, wherein the array of package connection pads has a perimeter depth substantially equal to a maximum number of signal traces routable between minimally spaced package connection pads a ring of die connection pads positioned within the array of package connection pads, the ring of die connection pads configured to provide electrically connectivity to an integrated circuit die; and an access region positioned within the ring of die connection pad, the access regions configured to facilitate backside access to the integrated circuit die by removal of as much as all of the access region without damaging electrical integrity of any circuit traces of the carrier substrate.

3. The apparatus of claim 2, wherein the carrier substrate comprises a plurality of circuit traces configured to electrically connect the array of package connection pads to the ring of die connection pads without penetrating the access region.

4. The apparatus of claim 2, wherein the carrier substrate comprises a single signal layer.

5. The apparatus of claim 2, wherein the access region corresponds to a substrate cavity.

6. The apparatus of claim 5, wherein the integrated circuit die is positioned within the substrate cavity.

7. The apparatus of claim 6, further comprising a package body molded over the integrated circuit die.

8. The apparatus of claim 2, further comprising a heat spreader thermally connected to a bottom surface of the substrate.

9. The apparatus of claim 2 wherein the ring of die connection pads comprises a quadrant of bonding fingers that arc substantially equally distanced from an edge of the integrated circuit die.

10. The apparatus of claim 2, further comprising at least one grounding ring surrounding the access region.

11. The apparatus of claim 2, further comprising an array of solder balls attached to the array of package connection pads.

12. The apparatus of claim 2, wherein the carrier substrate is a printed circuit board.

13. The apparatus of claim 2, wherein the array of package connection pads is configured to receive an array of solder balls.

14. An apparatus for packaging and providing backside access to
an integrated circuit, the apparatus comprising:
a carrier substrate;
an array of package connection pads positioned around a periphery of a top surface of the carrier substrate, wherein the array of package connection pads has a perimeter depth that is less than a package connection pad spacing divided by a trace pitch
a ring of die connection pads positioned within the array package connection pads, the ring of die connection pads configured to provide electrically connectivity to an integrated circuit die; and
an access region positioned within the ring of die connection pads, the access region configured to facilitate backside access to the integrated circuit die by removal of as much as all of the access region without damaging electrical integrity of any circuit traces of the carrier substrate.

15. A method for designing an integrated circuit carrier with backside access to an integrated circuit, the method comprising:
placing an array of package connection pads around a periphery of a top surface of a carrier substrate;
placing a ring of die connection pads within the array of package connection pads, the ring of die connection pads configured to provide electrically connectivity to an integrated circuit die; and
reserving an access region for conducting backside access to the integrated circuit die, wherein no signal traces are disposed.

16. A method for designing an integrated circuit carrier with backside access to an integrated circuit, the method comprising:
placing an array of package connection pads around a periphery of a top surface of a carrier substrate,
placing a ring of die connection pads within the array of package connection pads, the ring of die connection pads configured to provide electrically connectivity to an integrated circuit die,
reserving an access region for conducting backside access to the integrated circuit die, wherein no signal traces are disposed, and
selecting a perimeter depth for the array of package connection pads that is less than package connection pad spacing divided by a trace pitch.

17. The method of claim 16, further comprising placing at least one grounding ring surrounding the access region.

18. The method of claim 16, further comprising selecting a quadrant shape for a quadrant of bonding fingers such that the bonding fingers are substantially equally distanced to an edge of an integrated circuit die.

19. The method of claim 16, further comprising routing a plurality of traces between a ring of die connection pads and an array of package connection pads without penetrating the access region.

20. A method for packaging and providing backside access to
an integrated circuit, the method comprising:
electrically connecting an integrated circuit die to a ring of die connection pads on a top surface of a carrier substrate;
attaching a cover to a bottom surface of the carrier substrate; and
removing a portion of the cover within an access region in order to access a backside of the integrated circuit without damaging any electrical connectivity of the substrate.

21. The method of claim 20, further comprising placing the integrated circuit die within a cavity of the carrier substrate.

22. The method of claim 20, further comprising molding a package body over the integrated circuit die.

23. The method of claim 20, farther comprising attaching an array of solder balls to the array of package connection pads.

24. A system for packaging and providing backside access to a wide variety of integrated circuits, the system comprising:
a plurality of circuit carriers, each circuit carrier configured to receive a range of integrated circuit sizes and I/O counts, each circuit carrier overlapping in size range with at least one other circuit carrier of the plurality of circuit carriers, each circuit carrier comprising:
a carrier substrate;

an array of package connection pads positioned around a periphery of a top surface of the carrier substrate;

a ring of die connection pads positioned within the array of package connection pads; and an access region positioned within the ring of die connection pads, the access region configured to facilitate backside access to the integrated circuit die by removal of as much as all of the access region without damaging electrical integrity of any circuit traces of the carrier substrate.

25. The system of claim 24, wherein each circuit carrier overlaps in size range with no more than two other circuit carriers of the plurality of circuit carriers.

* * * * *